(12) United States Patent
Bernds et al.

(10) Patent No.: US 7,329,559 B2
(45) Date of Patent: Feb. 12, 2008

(54) USE OF CONDUCTIVE CARBON BLACK/GRAPHITE MIXTURES FOR THE PRODUCTION OF LOW-COST ELECTRONICS

(75) Inventors: Adolf Bernds, Baiersdorf (DE); Henning Rost, Erlangen (DE); Alexander Knobloch, Erlangen (DE)

(73) Assignee: PolyIC GmbH & Co. KG, Furth (DE)

( * ) Notice: Subject to any disclaimer, the term of this patent is extended or adjusted under 35 U.S.C. 154(b) by 367 days.

(21) Appl. No.: 10/542,679

(22) PCT Filed: Jan. 14, 2004

(86) PCT No.: PCT/EP2004/000214

§ 371 (c)(1),
(2), (4) Date: Jul. 19, 2005

(87) PCT Pub. No.: WO2004/066411

PCT Pub. Date: Aug. 5, 2004

(65) Prior Publication Data

US 2006/0057769 A1    Mar. 16, 2006

(30) Foreign Application Priority Data

Jan. 21, 2003    (DE)    ................................ 103 02 149

(51) Int. Cl.
*H01L 51/40* (2006.01)
(52) U.S. Cl. .................. 438/99; 257/E51.001
(58) Field of Classification Search .................... 438/99
See application file for complete search history.

(56) References Cited

U.S. PATENT DOCUMENTS

| | | |
|---|---|---|
| 3,512,052 A | 5/1970 | MacIver et al. |
| 3,769,096 A | 10/1973 | Ashkin |
| 3,955,098 A | 5/1976 | Kawamoto |
| 4,302,648 A | 11/1981 | Sado et al. |
| 4,442,019 A | 4/1984 | Marks |
| 4,865,197 A | 9/1989 | Craig |
| 4,926,052 A | 5/1990 | Hatayama |
| 5,173,835 A | 12/1992 | Cornett et al. |
| 5,206,525 A | 4/1993 | Yamamoto et al. |
| 5,259,926 A | 11/1993 | Kuwabara et al. |
| 5,321,240 A | 6/1994 | Takihira |
| 5,347,144 A | 9/1994 | Garnier et al. |
| 5,395,504 A | 3/1995 | Saurer et al. |
| 5,480,839 A | 1/1996 | Ezawa et al. |
| 5,486,851 A | 1/1996 | Gehner et al. |
| 5,502,396 A | 3/1996 | Desarzens |
| 5,546,889 A | 8/1996 | Wakita et al. |
| 5,569,879 A | 10/1996 | Gloton et al. |
| 5,574,291 A | 11/1996 | Dodabalapur et al. |
| 5,578,513 A | 11/1996 | Maegawa |
| 5,580,794 A | 12/1996 | Allen |
| 5,629,530 A | 5/1997 | Brown et al. |
| 5,630,986 A | 5/1997 | Charlton et al. |
| 5,652,645 A | 7/1997 | Jain |
| 5,691,089 A | 11/1997 | Smayling |
| 5,729,428 A | 3/1998 | Sakata et al. |
| 5,854,139 A | 12/1998 | Kondo et al. |
| 5,869,972 A | 2/1999 | Birch et al. |
| 5,892,244 A | 4/1999 | Tanaka et al. |
| 5,946,551 A | 8/1999 | Dimitrakopoulos |
| 5,967,048 A | 10/1999 | Fromson et al. |
| 5,970,318 A | 10/1999 | Choi et al. |
| 5,973,598 A | 10/1999 | Beigel |
| 5,997,817 A | 12/1999 | Crismore et al. |
| 6,036,919 A | 3/2000 | Thym et al. |
| 6,045,977 A | 4/2000 | Chandross et al. |
| 6,060,338 A | 5/2000 | Tanaka et al. |
| 6,083,104 A | 7/2000 | Choi |
| 6,087,196 A | 7/2000 | Sturm et al. |
| 6,133,835 A | 10/2000 | DeLeeuw et al. |
| 6,207,472 B1 | 3/2001 | Callegari et al. |
| 6,215,130 B1 | 4/2001 | Dodabalapur |
| 6,251,513 B1 | 6/2001 | Rector et al. |
| 6,284,562 B1 | 9/2001 | Batlogg et al. |
| 6,300,141 B1 | 10/2001 | Segal et al. |
| 6,321,571 B1 | 11/2001 | Themont et al. |
| 6,322,736 B1 | 11/2001 | Bao |
| 6,335,539 B1 | 1/2002 | Dimitrakopoulos et al. |
| 6,340,822 B1 | 1/2002 | Brown et al. |
| 6,344,662 B1 | 2/2002 | Dimitrakopoulos et al. |
| 6,403,396 B1 | 6/2002 | Gudesen et al. |
| 6,429,450 B1 | 8/2002 | Mutsaers et al. |
| 6,803,262 B2 * | 10/2004 | Wu et al. .................. 438/149 |

(Continued)

FOREIGN PATENT DOCUMENTS

DE    424 38 32    6/1994

(Continued)

OTHER PUBLICATIONS

U.S. Appl. No. 10/344,926, filed Feb. 12, 2004, Adolf Bernds et al.

(Continued)

*Primary Examiner*—David A. Zarneke
(74) *Attorney, Agent, or Firm*—Carella Byrne Bain et al.; Elliot M. Olstein; William Squire

(57) ABSTRACT

Disclosed are conductive polymer solutions employed for the production of organic electronic components, which solutions are particularly useful for printing an organic element of an electronic component. To this end, particles of carbon black and graphite are used in the form of microplatelets in the polymer solutions. The components may include organic transistors and circuits, organic diodes, organic-based capacitors, organic photovoltaic cells, organic sensors and actuators, and combinations thereof.

10 Claims, No Drawings

U.S. PATENT DOCUMENTS

| | | |
|---|---|---|
| 6,517,955 B1 | 2/2005 | Jacobsen et al. |
| 6,852,583 B2 | 2/2005 | Bernds et al. |
| 6,903,958 B2 | 6/2005 | Bernds et al. |
| 2002/0018911 A1 | 2/2002 | Bernius et al. |
| 2002/0022284 A1 | 2/2002 | Heeger |
| 2002/0025391 A1 | 2/2002 | Angelopoulos |
| 2002/0053320 A1 | 5/2002 | Duthaler |
| 2002/0056839 A1 | 5/2002 | Joo et al. |
| 2002/0068392 A1 | 6/2002 | Lee et al. |
| 2002/0130042 A1 | 9/2002 | Moerman et al. |
| 2002/0170897 A1 | 11/2002 | Hall |
| 2002/0195644 A1 | 12/2002 | Dodabalapur et al. |
| 2003/0059987 A1 | 3/2003 | Sirringhaus et al. |
| 2003/0112576 A1 | 6/2003 | Brewer et al. |
| 2004/0002176 A1 | 1/2004 | Xu |
| 2004/0013982 A1 | 1/2004 | Jacobson et al. |
| 2004/0026689 A1 | 2/2004 | Bernds et al. |
| 2004/0084670 A1 | 5/2004 | Tripsas et al. |
| 2004/0211329 A1 | 10/2004 | Funahata et al. |
| 2004/0262599 A1* | 12/2004 | Bernds et al. ............... 257/40 |
| 2006/0105492 A1* | 5/2006 | Veres et al. ................. 438/99 |

FOREIGN PATENT DOCUMENTS

| | | |
|---|---|---|
| DE | 198 52 312 | 5/1999 |
| DE | 198 16 860 | 11/1999 |
| DE | 199 18 193 | 11/1999 |
| DE | 100 06 257 | 9/2000 |
| DE | 199 21 024 | 11/2000 |
| DE | 199 33 757 | 1/2001 |
| DE | 695 19 782 | 1/2001 |
| DE | 199 37 262 | 3/2001 |
| DE | 100 12 204 | 9/2001 |
| DE | 100 33 112 | 1/2002 |
| DE | 100 43 204 | 4/2002 |
| DE | 100 58 559 | 5/2002 |
| DE | 100 61 297 | 6/2002 |
| DE | 101 17 663 | 10/2002 |
| DE | 102 19 905 | 12/2003 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 442 123 | 8/1991 |
| EP | 0 460 242 | 12/1991 |
| EP | 0 501 456 A2 | 9/1992 |
| EP | 0 501 456 A3 | 9/1992 |
| EP | 0 511 807 | 11/1992 |
| EP | 0 528 662 | 2/1993 |
| EP | 0 685 985 | 12/1995 |
| EP | 0 716 458 | 6/1996 |
| EP | 0 785 578 A2 | 7/1997 |
| EP | 0 785 578 A3 | 7/1997 |
| EP | 0 615 256 | 9/1998 |
| EP | 0 962 984 | 12/1999 |
| EP | 0 966 182 | 12/1999 |
| EP | 0 979 715 | 2/2000 |
| EP | 0 981 165 | 2/2000 |
| EP | 0 989 614 A2 | 3/2000 |
| EP | 1 048 912 | 11/2000 |
| EP | 1 052 594 | 11/2000 |
| EP | 1 065 725 A2 | 1/2001 |
| EP | 1 065 725 A3 | 1/2001 |
| EP | 1 083 775 | 3/2001 |
| EP | 1 102 335 A2 | 5/2001 |
| EP | 1 103 916 | 5/2001 |
| EP | 1 104 035 A2 | 5/2001 |
| EP | 1 134 694 | 9/2001 |
| EP | 1 224 999 A1 | 7/2002 |
| EP | 1 237 207 | 9/2002 |
| EP | 1 318 084 | 6/2003 |
| FR | 2793089 | 11/2000 |
| GB | 723598 | 2/1955 |
| GB | 2 058 462 | 4/1981 |
| GR | 2001P20024 | 8/2000 |
| GR | 2001P03239 | 1/2001 |
| JP | 54069392 | 6/1979 |
| JP | 60117769 | 6/1985 |
| JP | 61001060 | 1/1986 |
| JP | 61167854 | 7/1986 |
| JP | 362065477 A | 3/1987 |
| JP | 01169942 | 7/1989 |
| JP | 05152560 | 6/1993 |
| JP | 05259434 | 10/1993 |
| JP | 05347422 | 12/1993 |
| JP | 08197788 | 8/1995 |
| JP | 09083040 | 3/1997 |
| JP | 09320760 | 12/1997 |
| JP | 10026934 | 1/1998 |
| JP | 2969184 B | 11/1999 |
| JP | 2001085272 | 3/2001 |
| WO | WO 93/16491 | 8/1993 |
| WO | WO 94/17556 | 8/1994 |
| WO | WO 95/06240 | 3/1995 |
| WO | WO 95/31831 | 11/1995 |
| WO | WO 96/02924 | 2/1996 |
| WO | WO 96/19792 | 6/1996 |
| WO | WO 97/12349 | 4/1997 |
| WO | WO 97/18944 | 5/1997 |
| WO | WO 98/18156 | 4/1998 |
| WO | WO 98/18186 | 4/1998 |
| WO | WO 98/40930 | 9/1998 |
| WO | WO 99/07189 | 2/1999 |
| WO | WO 99/10929 | 3/1999 |
| WO | WO 99/10939 | 3/1999 |
| WO | WO 99/21233 | 4/1999 |
| WO | WO 99/40631 | 8/1999 |
| WO | WO 99/53371 | 10/1999 |
| WO | WO 99/54936 | 10/1999 |
| WO | WO 99/66540 | 12/1999 |
| WO | WO 00/33063 | 6/2000 |
| WO | WO 00/36666 | 6/2000 |
| WO | WO 00/79617 | 12/2000 |
| WO | WO 01/03126 | 1/2001 |
| WO | WO 01/06442 | 1/2001 |
| WO | WO 01/08241 | 2/2001 |
| WO | WO 01/15233 | 3/2001 |
| WO | WO 01/17029 | 3/2001 |
| WO | WO 01/17041 | 3/2001 |
| WO | WO 01/27998 | 4/2001 |
| WO | WO 01/46987 | 6/2001 |
| WO | WO 01/47044 A2 | 6/2001 |
| WO | WO 01/47044 A3 | 6/2001 |
| WO | WO 01/47045 | 6/2001 |
| WO | WO 01/73109 A2 | 10/2001 |
| WO | WO 01/73109 A3 | 10/2001 |
| WO | WO 02/05360 | 1/2002 |
| WO | WO 02/05361 | 1/2002 |
| WO | WO 02/15264 | 2/2002 |
| WO | WO 02/19443 | 3/2002 |
| WO | WO 02/29912 | 4/2002 |
| WO | WO 02/43071 | 5/2002 |
| WO | WO 02/065557 A1 | 8/2002 |
| WO | WO 02/071139 | 9/2002 |
| WO | WO 02/071505 | 9/2002 |
| WO | WO 02/076924 | 10/2002 |
| WO | WO 02/091495 | 11/2002 |
| WO | WO 02/095805 A2 | 11/2002 |
| WO | WO 02/095805 A3 | 11/2002 |
| WO | WO 02/099907 | 12/2002 |
| WO | WO 02/099908 | 12/2002 |
| WO | WO 03/046922 | 6/2003 |
| WO | WO 03/067680 | 8/2003 |
| WO | WO 03/069552 | 8/2003 |

| | | |
|---|---|---|
| WO | WO 03/081671 | 10/2003 |
| WO | WO 03/095175 | 11/2003 |
| WO | WO 2004/032257 | 4/2004 |
| WO | WO 04/042837 A2 | 5/2004 |
| WO | WO 04/042837 A3 | 5/2004 |
| WO | WO 04/7194 A2 | 6/2004 |
| WO | WO 04/7194 A3 | 6/2004 |
| WO | WO 04/047144 A2 | 6/2004 |
| WO | WO 04/047144 A3 | 6/2004 |
| WO | WO 2004/083859 | 9/2004 |

OTHER PUBLICATIONS

U.S. Appl. No. 10/344,951, filed Feb. 12, 2004, Adolf Bernds et al.
U.S. Appl. No. 10/362,932, filed Oct. 2, 2003, Adolf Bernds et al.
U.S. Appl. No. 10/380,113, filed Sep. 25, 2003, Adolf Bernds et al.
U.S. Appl. No. 10/381,032, filed Feb. 12, 2004, Adolf Bernds et al.
U.S. Appl. No. 10/433,959, filed Apr. 1, 2004, Adolf Bernds.
U.S. Appl. No. 10/433,961, filed Apr. 1, 2004, Wolfgang Clemens et al.
U.S. Appl. No. 10/451,108, filed May 13, 2004, Mark Giles et al.
U.S. Appl. No. 10/467,636, filed Nov. 4, 2004, Adolf Bernds et al.
U.S. Appl. No. 10/473,050, filed May 20, 2004, Adolf Bernds et al.
U.S. Appl. No. 10/479,234, filed Dec. 30, 2004, Adolf Bernds et al.
U.S. Appl. No. 10/479,238, filed Oct. 20, 2004, Adolf Bernds et al.
U.S. Appl. No. 10/492,922, filed Mar. 3, 2005, Erwann Buillet et al.
U.S. Appl. No. 10/492,923, filed Dec. 23, 2004, Wolfgang Clemens et al.
U.S. Appl. No. 10/498,610, Walter Fix et al.
U.S. Appl. No. 10/508,640, Walter Fix et al.
U.S. Appl. No. 10/508,737, Adolf Bernds et al.
U.S. Appl. No. 10/517,750, Wolfgang Clemens et al.
U.S. Appl. No. 10/523,216, Adolf Bernds et al.
U.S. Appl. No. 10/523,487, Wolfgang Clemens et al.
U.S. Appl. No. 10/524,646, Walter Fix et al.
U.S. Appl. No. 10/533,756, Wolfgang Clemens et al.
U.S. Appl. No. 10/534,678, Wolfgang Clemens et al.
U.S. Appl. No. 10/535,448, W. Clemens et al.
U.S. Appl. No. 10/535,449, Walter Fix et al.
U.S. Appl. No. 10/541,815, Axel Gertt et al.
U.S. Appl. No. 10/541,956, Wolfgang Clemens et al.
U.S. Appl. No. 10/541,957, Walter Fix et al.
U.S. Appl. No. 10/543,561, Wolfgang Clemens et al.
U.S. Appl. No. 10/542,678, Adolf Bernds et al.
U.S. Appl. No. 10/542,679, Adolf Bernds et al.
Assadi A, et al:, Field-Effect Mobility of Poly (3-Hexylthiophene) Dept. of Physics and Measurement Technology, Received Mar. 3, 1988; accepted for Publication May 17, 1988.
Bao, Z. et al., "High-Performance Plastic Transistors Fabricated by Printing Techniques", Chem. Mater vol. 9, No. 6, 1997, pp. 1299-1301.
Brabec, C.J. et al, " Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.
Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.
Braun D., et al, "Visible light emission from semiconducting polymer diodes", American Institute of Physics, Applied Physics Letters 58, May 6, 1991, pp. 1982-1984.
Brown, A.R. et al., "Field-effect transistors made from solution-processed organic semiconductors", Elsevier Science, S.A., Synthetic Metals 88 (1997) pp. 37-55.
Brown, A.R., "Logic Gates Made from Polymer Transistors and Their Use in Ring Oscillators", Science, vol. 270, Nov. 10, 1995, pp. 972-974.
Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devcies, vol. 43, No. 9, Sep. 1996.

Chen, X.L. et al., "Morphological and Transistor Studies of Orgranic Molecular Semiconductors with Anisotropic Electrical Characteristics", American Chemical Society, 2001, Chem. Mater. 2001, 13, 1341-1348.
Clemens, W. et al., "Vom Organischen Transistor Zum Plastik-Chip," Physik Journal, V. 2, 2003, pp. 31-36.
Collet J. et al:, Low Voltage, 30 NM Channel Length, Organic Transistors with a Self-Assembled Monolayer as Gate Insulating Films:, Applied Physics Letters, American Institute of Physics, New York, US, Bd 76, Nr. 14, Apr. 3, 2000, Seiten 1941-1943, XP000950589, ISSN:0003-6951, das ganze Dokument.
Crone, B. et al, "Large-scale complementary Integrated circuits based on Organic transistors", Nature, vol. 403, Feb. 3, 2000, pp. 521.
Dai, L. et al, Photochemical Generation of Conducting Pattersn in Polybutadiene Films:, Macromolecules, vol. 29, No. 1, 1996, pp. 282-287, XP 001042019, the whole document.
Dai, L. et al., "$I_2$-Doping" of 1,4-Polydienes, Elsevier Science S.A., Synthetic Metals 69 (1995), pp. 563-566.
Dai, L. et al., "Conjugation of Polydienes by Oxidants Other Than Iodine", Elsevier Science S.A., Synthetic Metals 86 (1997) 1893-1894.
De Leeuw D.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.
Dodabalapur, A. et al., Organic smart pixels, American Institute of Physics, Applied Physics Letters, vol. 73, No. 2, Jul. 13, 1998, pp. 142-144.
Ficker, J. et al., "Dynamic and Lifetime Measurements of Polymer OFETS and Integrated Plastic Circuits," Proc. of SPIE, v. 466, 2001, pp. 95-102.
Fix, W. et al., "Fast Polymer Integrated Circuits Based on a Polyfluorene Derivative", ESSDERC 2002, 2002, pp. 527-529.
Fix, W., et al., "Fast polymer integrated circuits", American Institute of Physics, Applied Physics Letters, vol. 81, No. 89, Aug. 2002, pp. 1735-1737.
Fraunhofer Magazin- Polytronic Chips Von der Rolle, Apr. 2001, pp. 8-13.
Garnier F et al:, "Vertical Devices Architecture By Molding Of Organic-Based Thin Film Transistor", Applied Physics Letters, American Institute Of Physics. XP000784120, issn: 003-6951 abbildung 2.
Garnier et al., "Conjugated Polymers and Oligomers as Active Material For Electronic Devices", Synthetic Metals, vol. 28, 1989.
Gelinck, G.H. et al., "High-Performance All-Polymer Integrated Circuits", Applied Physics Letters, v. 77, 2000, pp. 1487-1489.
Gosain, D.P., "Excimer laser crystalized poly-Si TFT's on plastic substrates", Second International Symposium on Laser Precision Microfabrication, May 16-18, 2001, Singapore, vol. 4426, pp. 394-400.
Halls, J.J.M., et al., "Efficient photodiodes from interpenetrating polymer networks", Nature, vol. 376, Aug. 10, 1995, pp. 498-500.
Harsanyi G. et al, "Polytronics for biogtronics:unique possibilities of polymers in biosensors and BioMEMS", IEEE Polytronic 2002 Conference, Jun. 23, 2002, pp. 211-215.
Hebner, T.R. et al., Ink-jet printing of doped polymers for organic light emitting devices:, American Institute of Physics, Applied Physics Letters, vol. 72, No. 5, Feb. 2, 1998, pp. 519-521.
Hwang J D et al:, "A Vertical Submicron Sic thin film transistor", Solid State Electronics, Elsevier Science Publishers, Barking, GB, Bd. 38, NR. 2, Feb. 1, 1995, Seiten 275-278, XP004014040, ISSN:0038-1101, Abbildung 2.
IBM Technical Disclosure Bulletin, "Short-Channel Field-Effect Transistor", IBM Corp., New York, US, Bd. 32, Nr. 3A, Aug. 1, 1989, Seiten 77-78, XP000049357, ISSN:0018-8689, das ganze Dokument.
Kawase, T. et al., "Inkjet Printed Via-Hole Interconnections and Resistors for All-Polymer Transistor Circuits", Advanced Materials 2001, 13, No. 21, Nov. 2, 2001, pp. 1601-1605.
Klauk, H. et al., "Fast Organic Thin Film Transistor Circuits", IEEE Electron Device Letters, vol. 20, No. 6, pp. 289-291.

Klauk, H. et al., "Pentacene Thin Film Transistors and Inverter Circuits", 1997 International Exectron Devices Meeting Technical Digest, pp. 539-542, Dec. 1997.

Knobloch, A. et al., "Printed Polymer Transistors", Proc. Polytronic, v. 84, 2001, pp. 84-89.

Kobel W. et al., "Generation of Micropatterns in Poly (3-Methyl-Thiophene) Films Using Microlithography: A First Step in the Design of an all-Organic Thin-Film Transistor" Synthetic Metals, V. 22, 1988, pp. 265-271.

Koezuka, H. et al., "Macromolecular Electronic Device", Mol. Cryst. Liq. Cryst. 1994, vol. 2555, pp. 221-230.

Kumar, Anish et al:, "Kink-Free Polycrystalline Silicon Double-Gate Elevated-Channel Thin-Film Transistors", IEEE Transactions on Electron Devices, vol 45, No. 12, Dec. 1998.

Lidzey, D. G. et al., "Photoprocessed and Micropatterned Conjugated Polymer LEDs", Synthetic Metals, V. 82, 1996, pp. 141-148.

Lowe, J. et al., "Poly (3—(2—Acetoxyethyl)Thiophene): A Model Polymer for Acid-Catalyzed Lithography", Synthetic Metals, Elsevier Sequoia, Lausanne, CH, Bd. 85, 1997, Seiten 1427-1430.

Lu, Wen et al., "Use of Ionic Liquids for $\pi$-Conjugated Polymer Electrochemical Devices", Science, vol. 297, 2002, pp. 983-987/.

Lucent Technologies, "Innovation marks significant milestone in the development of electronic paper", Cambridge, MA and Murray Hill, NJ, Nov. 20, 2000. XP-002209726.

Manuelli, Alessandro et al., "Applicability of Coating Techniques for the Production of Organic Field Effect Transistors", IEEE Polytronic 2002 Conference, 2002, pp. 201-204.

Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.

Oelkrug, D. et al., "Electronic spectra of self-organized oligothiophene films with 'standing' and 'lying' molecular units", Elsevier Science S.A., 1996, Thin Solid Films 284-270.

Qiao, X. et al., "The FeCl3-doped poly3-alkithiophenes) in solid state", Elsevier Science, Synthetic Metals 122 (2001) pp. 449-454.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9648, das ganze Dokument.

Roman et al., "Polymer Diodes with High Rectification:, Applied Physics Letters, vol. 75, No. 21, Nov. 22, 1999.

Rost, Henning et al., "All-Polymer Organic Field Effect Transistors", Proc. Mat. Week, CD, 2001, pp. 1-6.

Sandberg, H. et al, "Ultra-thin Organic Films for Field Effect Transistors", SPIE vol. 4466, 2001, pp. 35-43.

Schoebel, "Frequency Conversion with Organic-On-Inorganic Heterostructured Diodes", Extended Abstracts of the International Conference on Solid State Devices and Materials, Sep. 1, 1997.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr. Seitenn 91—94.

Shaheen, S.E., "Low band-gap polymeric photovoltaic devices", Synthetic Metals, vol. 121, 2001, pp. 1583-1584.

Takashima, W. et al., "Electroplasticity Memory Devices Using Conducting Polymers and Solid Polymer Electrolytes", Polymer International, Melbourne, 1992, pp. 249-253.

Ullman, A. et al., "High Performance Organic Field-Effect Transistors and Integrated inverters", Mat. Res. Soc. Symp. Proc., v. 665, 2001, pp. 265-270.

Velu, G. et al. "Low Driving Voltages and Memory Effect in Organic Thin-Film Transistors With A Ferroelectric Gate Insulator", Applied Physics Letters, American Institute of Physics, New York, Vo.1 79, No. 5, 2001, pp. 659-661.

Wang, Hsing Lin et al., Conducting Polymer Blends; Polythiophene and Polypyrrole Blends with Polystyrene and Poly (bisphenol A carbonate), American Chemical Society, 1990 pp. 1053-1059.

Wang, Yading et al., "Electrically Conductive Semiinterpenetrating Polymer Networks of Poly(3-octylthiophene)", Macromolecules 1992, vol. 25, pp. 3284-3290.

Yu, G. et al., "Dual-function semiconducting polymer devices: Light-emitting and photodetecting diodes", American Institute of Physics, Applied Physics Letter 64, Mar. 21, 1994, pp. 1540-1542.

Zheng, Xiang-Yang et al., "Electrochemical Patterning of the Surface of Insulators with Electrically Conductive Polymers", J. Electrochem. Soc., v. 142, 1995, pp. L226-L227.

* cited by examiner

USE OF CONDUCTIVE CARBON BLACK/GRAPHITE MIXTURES FOR THE PRODUCTION OF LOW-COST ELECTRONICS

The invention relates to conductive polymer solutions, which can be employed for the production of organic electronic components.

The production of low-cost polymer electronics by printing is being continuously developed following conventional techniques, such as are employed, for example, in graphical industries. Significant disadvantages, however, arise, because on the one hand only a drastically increased resolution of the structures can provide microelectronic components and on the other hand a layer quality is demanded without which no electrical contacts or conductor tracks are at all possible.

To this end, printable inks are being developed in which the conductive polymers are readily soluble, but these substances are only soluble within narrow limits because of their rheological properties such as viscosity, adhesion, and wetting power and thus, when printed, still do not satisfy the requirements which are placed on the structure and layer quality.

Polymer solutions are known which can be rendered conductive by addition of carbon black or graphite. A mixture of carbon black particles and graphite particles is also known. The description thereof demonstrates how these mixtures can be advantageously employed for the construction of organic circuits. Other materials which improve the functionality of the layers can, of course, also be added to these mixtures, for example PANI or PEDOT.

In the case of the carbon black/graphite-filled polymer solutions, there are in this respect fewer problems, because these are variably printable within a larger concentration range in solution than the pure polymer solutions. Nevertheless, these solutions are not employed for the printing of polymer electronics, because the hard particles in the carbon black/graphite polymer solutions cause local damage to the microelectronic component and/or to the printing machine.

It is the object of the present invention to modify the particles of the carbon black/graphite particles in the polymer solutions in such a way that solutions result which cause damage neither to the components nor to the printing machines.

The invention relates to the use of a polymer solution filled with a carbon black/graphite mixture for the production of electronic components, in which solution the particles of carbon black and graphite are present substantially in the form of microplatelets.

Embodiments of the invention are evident from the subclaims.

Preferably, the method serves to construct organic electronic components, such as, for example, organic transistors and circuits containing same, organic diodes, organic-based capacitors, organic photovoltaic cells, organic sensors and actuators, and combinations thereof.

According to one embodiment, microplatelets are employed which are present in point-free form.

According to another embodiment of the invention, polymer solutions are employed which have a solids content of from 15 to 60% by weight, preferably from 20 to 45% by weight, and more preferably from 34.5 to 41% by weight.

The viscosity of the solutions used can vary greatly; both resins (viscosities between 20,000 and 40,000 mPa.s) and liquids (viscosities between 800 and 3600 mPa.s) can be employed, the term "solution" only relating to the fact that one component present is dissolved in another. The polymer solutions in question here can be liquid, gelatinous, solid or resinous, the addition of the carbon black/graphite particles again having an influence on the viscosity.

The choice of the solvent depends on the printing and/or drying properties to be achieved.

The polymer solutions containing microplatelets are highly suitable for use in low-cost microelectronics. The advantage of the polymer solutions resides in the fact that they not only provide satisfactory electrical functionality of the microelectronic component, but they also combine good processability, especially as regards the printing properties, with wide variability of the concentration of the particles of carbon black and graphite.

Preferably, carbon black/graphite-filled polymer solutions are employed which have been developed by Acheson Colloids Company (www.achesonindustries.com) for medical electrodes, battery casings, rubber resins and the like.

From the product range of Acheson materials, the type "Electrodag® PF-407A", a known screen printing material which is not conceived for use in the microelectronics field, is employed for the pad printing of vias and gate electrodes. The material showed itself to be stable and functional in individual polymer field-effect transistors up to and including ring oscillator switching circuits.

Furthermore, promising intaglio printing tests for source/drain electrodes have been performed using "Elektrodag® 109".

Disclosed are ready-to-print polymer solutions containing particles of carbon black and graphite substantially in the form of microplatelets employed for the production of polymeric microelectronic components useful in electronic devices and circuits.

The invention claimed is:

1. A method for the production of an electronic component comprising forming an element of the component with a polymer solution filled with a mixture of carbon black and graphite, in which solution the particles of carbon black and graphite are present substantially in the form of microplatelets.

2. The method as defined in claim 1, wherein said polymer solution contains additives.

3. The method as defined in claim 1, wherein the step for forming said element of the electronic component comprises at least one printing operation for printing said element with said solution.

4. The method as defined in claim 1 for the construction of an organic electronic component containing said element, further including the step of selecting the component from the group consisting of organic transistors and circuits, organic diodes, organic-based capacitors, organic photovoltaic cells, organic sensors and actuators, and combinations thereof.

5. The method as defined in claim 1 including selecting the solids content of the particles of carbon black and graphite in said solution in the range from about 15 to about 60% by weight.

6. The method as defined in claim 1 including selecting the particles of carbon black and graphite as microplatelets in point-free form.

7. The method of claim 2 including adding additives in the form of at least one of PEDOT and PANI.

8. The method of any one of claims 3-6 including adding additives to the polymer solution.

9. The method of any one of claims 2 and 4-7 wherein the step for forming said element of the electronic component comprises printing said element with said solution.

10. The method of any one of claims 2-3 and 5-7 for the construction of an organic electronic component containing said element, comprising the step of selecting the component from the group consisting of organic transistors and circuits, organic diodes, organic-based capacitors, organic photovoltaic cells, organic sensors and actuators, and combinations thereof.

* * * * *